United States Patent [19]

Kamperman et al.

[11] Patent Number: 5,773,195

[45] Date of Patent: Jun. 30, 1998

[54] CAP PROVIDING FLAT SURFACE FOR DCA AND SOLDER BALL ATTACH AND FOR SEALING PLATED THROUGH HOLES, MULTI-LAYER ELECTRONIC STRUCTURES INCLUDING THE CAP, AND A PROCESS OF FORMING THE CAP AND FOR FORMING MULTI-LAYER ELECTRONIC STRUCTURES INCLUDING THE CAP

[75] Inventors: James Steven Kamperman, Endicott; Thomas Patrick Gall, Lancaster; David Brian Stone, Owego, all of N.Y.

[73] Assignee: International Business Machines Corporation, Armonk, N.Y.

[21] Appl. No.: 480,300

[22] Filed: Jun. 7, 1995

Related U.S. Application Data

[62] Division of Ser. No. 352,144, Dec. 1, 1994, abandoned.

[51] Int. Cl.⁶ .................................................. G03F 7/00
[52] U.S. Cl. ......................... 430/312; 430/315; 430/394
[58] Field of Search ................................... 430/311, 312, 430/313, 314, 315, 394

[56] References Cited

U.S. PATENT DOCUMENTS

| | | |
|---|---|---|
| 3,509,270 | 4/1970 | Dube et al. . |
| 3,932,932 | 1/1976 | Goodman . |
| 4,268,585 | 5/1981 | Daur et al. . |
| 4,468,409 | 8/1984 | Thompson et al. . |
| 4,628,409 | 12/1986 | Thompson et al. ..................... 361/403 |
| 4,715,116 | 12/1987 | Thorpe et al. . |
| 4,755,911 | 7/1988 | Suzuki . |
| 4,788,766 | 12/1988 | Burger et al. . |
| 5,046,238 | 9/1991 | Daigle et al. . |
| 5,065,285 | 11/1991 | Nagai et al. . |
| 5,092,035 | 3/1992 | McMichen et al. . |
| 5,120,678 | 6/1992 | Moore et al. . |
| 5,200,580 | 4/1993 | Sienski ..................................... 174/264 |
| 5,243,142 | 9/1993 | Ishikawa et al. ........................ 174/262 |
| 5,356,755 | 10/1994 | Matsuda et al. ......................... 430/313 |

FOREIGN PATENT DOCUMENTS

| | | |
|---|---|---|
| 1-120891 | 5/1989 | Japan . |
| 3-262186 | 11/1991 | Japan . |
| 1428534 | 10/1988 | U.S.S.R. . |

OTHER PUBLICATIONS

IBM Technical Disclosure Bulletin, vol. 34, No. 12, 1 May 1992, pp. 85–86 XP000308436 "Via Rich Thin Film Wiring Scheme for Electronic Packaging".

IBM Technical Disclosure Bulletin, vol. 34, No. 7A, Dec. 1991, New York, U.S., pp. 416–418, XP002016877 Anonymous: "Solder Filled Vias in Pad for Surface Solder Applications".

*Primary Examiner*—Kathleen Duda
*Attorney, Agent, or Firm*—Pollock, Vande Sande & Priddy

[57] ABSTRACT

A process of forming a multi-layer electronic composite structure. At least one core including at least one functional plane of at least one electrically conducting material having a plane of at least one electrically insulating material on both sides of the at least one plane of at least one electrically conducting material is provided. The at least one core includes a plurality of plated through holes formed therethrough. A pad of an electrically-conducting material is provided over at least one of the plated through holes. The pad provides a flat surface for attaching an electronic device. The pad also prevents solder from entering the at least one plated through hole. Additionally, the pad provides an electrical connection between the electronic device and the at least one core.

11 Claims, 1 Drawing Sheet

CAP PROVIDING FLAT SURFACE FOR DCA AND SOLDER BALL ATTACH AND FOR SEALING PLATED THROUGH HOLES, MULTI-LAYER ELECTRONIC STRUCTURES INCLUDING THE CAP, AND A PROCESS OF FORMING THE CAP AND FOR FORMING MULTI-LAYER ELECTRONIC STRUCTURES INCLUDING THE CAP

This application is a divisional of U.S. patent application Ser. No. 08/352,144, filed Dec. 1, 1994, now abandoned.

FIELD OF THE INVENTION

The present invention relates to a structure for attaching devices to multi-layer electronic structures, such as circuit boards and cards. The invention also relates to methods for forming multi-layer electronic structures and to attaching electronic devices, such as integrated semi-conductor chips to multi-layer electronic structures.

BACKGROUND OF THE INVENTION

Multi-layer electronic structures such as circuit boards, circuit cards, chip carriers and other such devices typically are formed from a plurality of electrically conducting and electrically insulating planes. The electrically conducting planes function as ground, signal, and/or power planes and conduct electrical current from an attached electrical device to what ever the multi-layer structure is electrically connected to.

Usually, multi-layer electronic structures include a plurality of mounting sites on one or both surfaces to which a semiconductor chip or other electronic device is attached. Typically, the sites are made of an electrically conducting material and function as ground, power, and/or signal sites. Usually, the pattern of attachment sites on the structure, matches a pattern of power, ground, or signals sites on the attached device. The power, ground and/or signal connecting sites between the multi-layer structure and the chip or other attached device preferably are connected to the plurality of plated through holes formed through the multi-layer structure.

In forming the multi-layer circuit board or card, a plurality of printed circuit cores may first be formed and then joined to form the multi-layer structure. In such a procedure, each core typically is constructed from at least one plane of at least one electrically conducting material surrounded on both sides by a plane of at least one electrically insulating material. A plurality of through holes may then be formed in the electrically insulating and electrically conducting planes. Next, an electrically conducting material may be plated on the surface of the through holes.

In another embodiment, the cores are formed as described above. A plurality of holes are formed through the outer electrically insulating planes but not through the electrically conducting plane. These holes are then filled with an electrically conducting material. Such filled holes are commonly known as mounting or joining studs.

When using either of these methods to form the cores, a plurality of the cores are then stacked on top of each other and aligned so that the plated through holes or joining studs on adjacent cores are aligned. The stack of cores is then subjected to elevated temperatures and pressures so as to cause the electrically insulating material and the electrically conducting material on facing surfaces of adjacent cores or adjoining studs on adjacent cores to be joined together.

The composite multi-layer panel may also be processed by forming contacts for electrically connecting a chip or other device to the panel. Such contact sites may be formed by drilling a plurality of holes in the top surface of the panel and then depositing an electrically conductive material in the holes, similarly to the method described above used for providing mounting between cores of the composite. The filled holes may be electrically connected to the electrically conducting planes of the composite. The ground, signal, and power sites on a chip or other device are then aligned with the sites on the panel and then bonded thereto.

However, as device dimensions have decreased, and the number of mounting sites on chips and circuit boards has increased, the spacing between mounting sites has decreased. This makes it more difficult to join the chips and other devices to multi-layer composites and still provide a solder dam or other means for preventing solder from flowing away from the mounting sites.

SUMMARY OF THE INVENTION

The inventors of the present invention recognized the above-discussed problems, among others, and developed the present invention to over come these problems and other short comings of the prior art.

An object of the present invention is to provide a cap structure for attaching to a multi-layer composite electronic structure for providing an improved surface for mounting electronic devices.

An advantage of the present invention is to improve the multi-layer surface for attaching electronic devices to a multi-layer electronic composite enabling greater interconnect density.

In accordance with preferred aspects, the present invention provides a process of forming a multi-layer electronic composite structure. The process includes the step of providing at least one core including at least one plane of at least one electrically conducting material with a plane of at least one electrically insulating material on both sides of the at least one plane of at least one electrically conducting material. The at least one core also includes a plurality of plated through holes formed therethrough. Also according to the process, a pad is provided over at least one of the plated through holes. The pad provides a flat surface for attaching an electronic device and also prevents solder from entering the at least one plated through hole.

According to other preferred aspects, the present invention provides a cap for attaching a chip or other device to a surface of a multi-layer electronic structure. The multi-layer electronic structure includes a plurality of plated through holes formed through it. The cap includes a pad attached over at least one of the plated through holes of the multi-layer electronic structure. The pad includes a flat upper surface for attaching the chip or other device to the multi-layer structure and for sealing the plated through hole to prevent solder from entering the through hole.

According to further preferred aspects, the present invention provides a multi-layer electronic structure including at least one core including at least one plane of at least one electrically conducting material having a plane of at least one electrically insulating material on both sides of the at least one plane of at least one electrically conducting material. The at least one core includes a plurality of plated through holes formed therethrough. The multi-layer electronic structure also includes a pad attached over at least one of the plated through holes.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

DETAILED DESCRIPTION OF VARIOUS AND PREFERRED EMBODIMENTS

Figure 1:
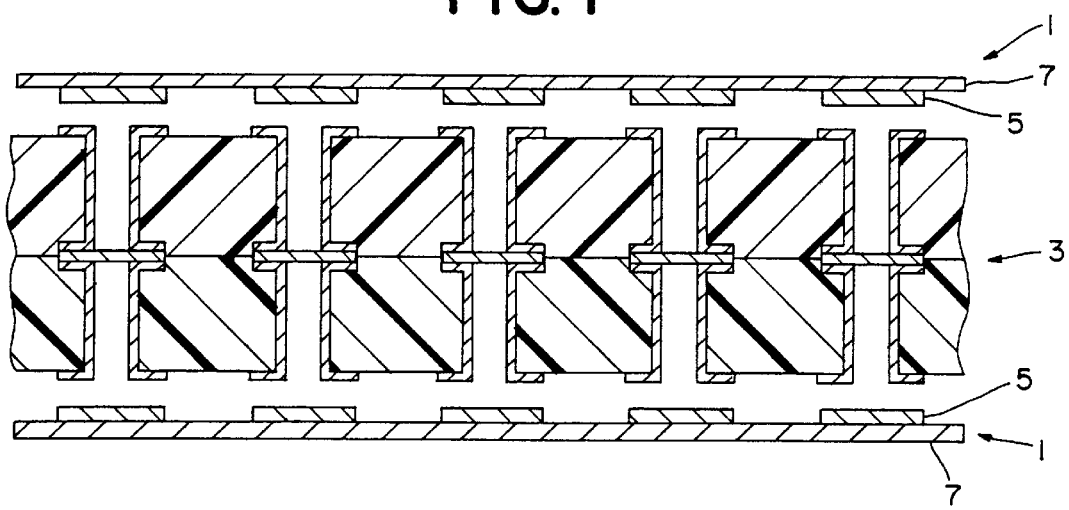
FIG. 1 represents a cross sectional view of a portion of a multi-layer circuit panel according to the present invention and top and bottom cap layers according to the present invention prior to attachment to the multi-layer panel.

As stated above, as the dimensions of circuits on chips have been reduced, the number of circuits on a chip has increased and the number of electrical connections which must be made to the chip has increased. The density of the ground, power, and signal sites on the chip to be attached to a circuit board or card or chip carrier have also increased. This increased number of attachment sites creates a number of problems, among them being the available space on the surface of the circuit board or card for assembly pads and plated holes.

Commonly known methods for directly attaching chips to another structure, such as a circuit board or card, require pads for attaching the chip. With an increased number of devices on chips and an increased number of input and output sites on chips, direct chip attach methods require pads on a fine area array pitch. For instance, the pitch may be on the order of about 8 to about 10 mil center-to-center spacing between pads.

According to known methods, if the holes used in forming the attachment sites in the circuit board or card are drilled, pads approximately 5 mil in diameter around holes about 3 mil in diameter are the smallest dimensions currently practical in commercial, mass-produced printed circuit board technology. Frequently, the pads are offset from the drilled holes and are provided with a solder dam to prevent the solder from wicking down the holes. However, as can be seen from the dimensions of the holes, pads, and array, the 9 mil grid of 5 mil pads leaves very little space for offsetting the pads from the drilled holes. Additionally, with this spacing little room remains for providing a solder dam between the plated through hole and bonding pad.

Mounting chips or solder balls, typically used in mounting chips or other devices, on drilled holes requires a method for plugging the holes to prevent solder from wicking away from the joint. Arranging the mounting pads directly over the drilled holes provides a maximum density of input and output sites and eliminates the need for a solder mask. However, this technique requires a flat surface.

One solution to the above problems has been to fill vias in the circuit board with solder. However, typical solders cannot withstand high temperatures associated with many processing steps used in processing circuit boards. Additionally, when depositing solder in holes in a circuit board, it is very difficult, if not impossible, to obtain a flat surface since the exact amount of solder cannot be easily known.

To provide an improved method and structure for attaching chips and other devices to circuit boards and cards, the present invention provides a method and structure for a multi-layer composite panel with a top surface including electrical conductors for attaching devices built in a separate parallel process and then joined to the multi-layer composite in a lamination process. The resulting structure preferably provides a flat surface suitable for direct chip attach. By providing a cap on the top and/or bottom surface of the multi-layer circuit board, the present invention provides top and/or bottom surfaces of the multi-layer composite which are flat and facilitate the plating of solder. The surface of the cap may be patterned so as to leave discrete conductors surrounded by dielectric material thereby eliminating the need for a solder mask to be added to the panel.

The capping process of the present invention also allows electroplating solder for attaching devices, eliminating the need for sputtering or plating an electrical commoning layer on the composite circuit. Additionally, the present invention provides a method of building such a cap. Further, the present invention is a method for providing a solder layer on a multi-layer circuit board composite by depositing solder on a carrier sheet attached to a cover sheet of an electrically conducting material. The resulting structure is laminated onto the composite circuit board.

The present invention also provides a process for forming a solder layer for a multi-layer composite, the solder layer sealing hollow vias formed in the multi-layer composite. The openings of the hollow are exposed on the top and bottom layers of the composite. By sealing these exposed open hollow vias, the cap layer of the present invention prevents materials used in processing steps subsequent to the attachment of the cap from entering the vias and becoming trapped where they may cause reliability problems.

To provide a flat surface for chip attachment, eliminate the need for a solder dam, as well as to provide other functions, the present invention provides a cap layer. The cap layer may be attached to the top and bottom layers of a circuit board or card, as needed. Further, once attached to a circuit board or card, the cap structure of the present invention may act as a hermetic seal, sealing hollow vias in the circuit board, thereby helping to prevent process chemicals employed in the solder plating and/or etch steps, among others, from entering the vias. This sealing function helps to prevent the risk of reliability due to solution trapped in the vias.

Accordingly, the present invention provides an improved structure and method of forming a structure for joining integrated semiconductor chips or other devices to a high density circuit card. According to the present invention, a cap structure may be formed separately from the multi-layer composite, such as a circuit board. The cap structure may then be attached to the top and/or bottom of the multi-layer composite. The cap structure preferably provides a flat surface for directly attaching a chip using direct chip attach methods, or alternatively solderable attachment processes including Ball Grid Array (BGA) or any other suitable attaching method. By providing a flat surface, the present invention also eliminates the need for a solder dam.

The cap structure preferably comprises a plurality of pads attached to the exposed openings of plated through holes of a circuit board or card. The pads may be attached to any number of the plated through holes. The pads preferably substantially completely seal the openings of the plated through holes. Accordingly, the pads preferably are large enough to seal the plated through holes. The exact size may vary, depending upon the application.

The pads may be formed of copper, gold, gold/tin, tin/lead, and/or any combination of these materials and/or any other electrically conducting material, alone or in combination with one or more of the above materials or in combination with another material.

Methods for forming multi-layer electronic composite structures according to the present invention include providing at least one core structure. The core structure preferably includes a plane of an electrically conducting material. A plane of an electrically insulating material may be provided on both sides of the plane of electrically conducting material. The core includes a plurality of plated through holes formed therethrough. The core may be formed according to known methods.

A pad is provided over an opening of each of the plated through holes in the at least one core. Each of the pads provides a flat surface for attaching a ground, signal, or power site of an electronic device, such as a semiconductor chip, to the pad. Each of the pads also helps to prevent solder from entering the plated through holes, thereby helping to prevent electrical and other problems associated with solder flow into the plated through holes.

Further according to methods of the present invention, a multi-layer electronic composite structure may be formed by first providing a composite panel. The composite structure may be formed from a plurality of cores, each core including at least one plane of an electrically conductive material surrounded by at least one plane of an electrically insulating material on opposite sides. A cap structure formed as described below may then be attached to the stack of cores and a device attached to the cap structure.

Forming a cap structure, according to methods of the present invention, for attaching a chip or other device to a multi-layer composite, such as a circuit board or card, may include providing a plane of an electrically conducting material. The electrically conducting material may, for instance, be copper. The copper may be in the form of a foil. The foil may be 2 ounce copper foil. However, other electrically conducting materials may be used and in different amounts.

A plurality of electrically conducting sites may be provided on one side of the plane of an electrically conducting material. The pattern of electrically connecting sites on the lower surface of the cap preferably matches the plated through hole or mounting or joining stud grid on the multi-layer composite. On the upper surface of the cap, the pattern of electrically conducting sites preferably matches the pattern of ground, signal and power sites on a chip or device to be attached to the cap and ultimately to the multi-layer composite.

The cap may then be joined to the composite circuit board on either side or on both sides of the circuit board or card. The material between the electrically conducting sites may then be removed according to known methods, thereby leaving a plurality of pads attached to each plated through hole. Then, a chip or other device may be attached to the resulting structure.

FIG. 1 shows a cross-sectional view of a portion of a multi-layer circuit panel according to the present invention and top and bottom cap 1 according to the present invention prior to attachment to the multi-layer panel 3. In FIG. 1, the electrically conducting material 5 are attached to the panel of an electrically conducting material 7. The electrically conducting material 5 forming part of the individual pads are positioned over the plated through holes 9. As described, the caps are then attached to the multi-layer structure 3.

Figure 2:
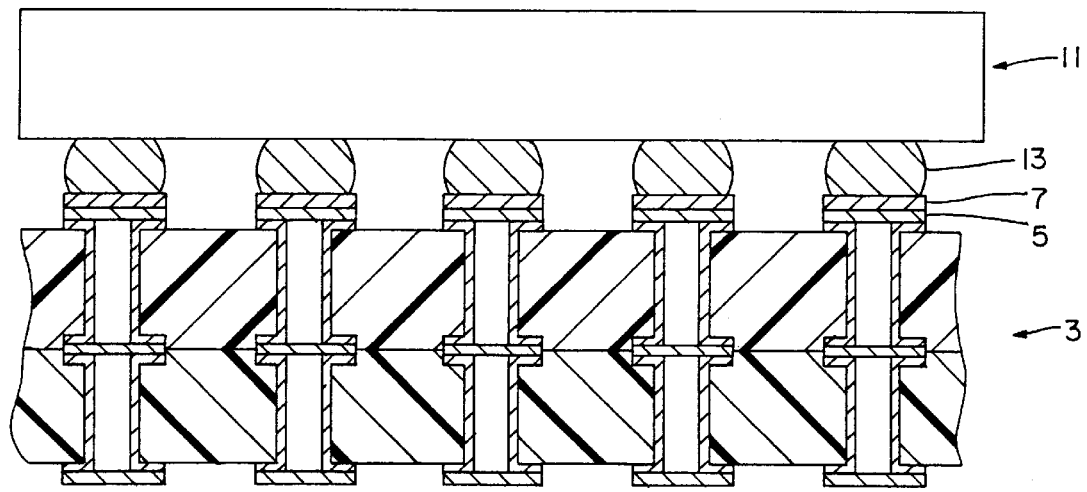
FIG. 2 represents a cross sectional view of an electronic device attached to an embodiment of a cap structure of the present invention, with the cap structure attached to a multi-layer circuit panel.

FIG. 2 represents a cross-sectional view of an electronic device 11 attached to an embodiment of a cap of the present invention, with the cap attached to a multi-layer circuit panel. The device 11 is attached using solder balls 13. In the embodiment shown in FIG. 2, the cap comprises a plurality of pads. Each pad shown in FIG. 2 comprises the electrically conducting material 5 and the portion of the panel 7 located above the material 5. The pads have also been attached to the side of the multi-layer structure opposite the side that the device is attached to. In some embodiments, the pads may also include a further portion of electrically conducting material attached to the portion of the panel opposite the electrically conducting material 5. Although in FIG. 2, a pad is attached over each plated through hole, according to the invention, a pad may not be placed over every through hole.

The cap structures discussed above may be formed of the same material as the multi-layer composite, thereby reducing problems associated with differences in coefficients of thermal expansion. A cap structure according to the present invention may be formed by providing a carrier sheet of an electrically conducting material. The electrically conducting material may be any known electrically conducting material. For example, the electrically conducting material in the panel from which the cap structure is formed and/or the electrically conducting material plated on the panel in the pattern of the ground, power, and/or signal sites of the may be metal such as copper or copper/INVAR/copper, or any other suitable electrically conducting material.

Further embodiments of methods of the present invention of forming a multi-layer electronic composite may include the step of providing at least one core including a plane of an electrically insulating material having a plane of an electrically insulating material on both sides of the plane of electrically conducting material. The at least one core may include a plurality of plated through holes formed therethrough.

A cap may be formed by providing a panel of a plane of an electrically conducting material including a top surface and a bottom surface. A layer of a photosensitive material may be deposited on the top and bottom surface of the electrically conductive plane of the panel. Marks for aligning the cores and the cap may be provided on the cap and/or the cores. The photosensitive material on the bottom surface of the electrically conducting plane may be exposed to radiation providing sufficient energy to cause photochemical reactions to occur within the photosensitive material. The bottom surface of the cap may be exposed in a pattern matching a pattern of plated through holes formed in the at least one core. All of the photosensitive material on the top surface of the electrically conducting plane of the panel may be exposed to radiation.

The portions of the photosensitive material not exposed to the radiation may be removed. The portions of the electrically conductive layer exposed by removing the portions of the photosensitive material may be cleaned. An electrically conducting material may be deposited on the exposed portions of the electrically conducting material. The electrically conducting material may be any commonly used material. For instance, gold, gold/tin, or lead/tin solder may be used. All remaining portions of the photosensitive material from the electrically conducting plane may be removed.

The electrically conducting material deposited on the electrically conducting plane may be aligned with the plated through holes on the core. The alignment of the electrically In an alternative embodiment, the portions of the photosensitive material deposited on the upper surface of the panel that are not removed during development may be used as a etch mask. In such an embodiment, the panel is etched so as to remove the portions exposed by the removal of the photosensitive material. The remaining photosensitive material preferably protects the portions of the panel over the plated through holes. After etching the panel, the remaining photosensitive material may then be removed.

In an embodiment in which the remaining photosensitive material does not serve as a mask, after etching, the electrically conducting material applied where the photosensitive material was removed may be subjected to elevated temperatures to cause any organic plating additives to outgas before attempting to attach a chip or other device. The applied electrically conducting material may then be subjected to pressure to flatten or dimple the material. If the photosensitive material is used as an etch mask, then the outgassing step may be deleted and the exposed portion of the panel may be subjected to pressure to flatten or dimple the panel material. In either embodiment, prior to flattening, the pad material may heated to a temperature sufficient to reflow the material.

A device, such as a semiconductor chip, may be attached to the conducting material on the electrically conductive plane with the plated through holes may be verified. The panel may be joined to the at least one core by laminating the bottom surface of the panel to the core.

The top surface of the panel may then be cleaned and a layer of a photosensitive material deposited on the top surface of the panel. Selected portions the photosensitive material on the top surface of the panel may then be exposed to radiation. The radiation preferably causes photochemical reactions to occur within the photosensitive material. The photosensitive material may then be developed to remove portions of the photosensitive material, leaving portions either exposed or not exposed, depending upon the type of photosensitive material used.

An electrically conducting material may then be deposited on the portions of the surf ace of the top of the panel uncovered by the removal of the photosensitive material. The electrically conducting material forming the base of the panel may then be etched, using the just applied electrically conducting material as a mask. One etchant that may be used is ammonium chloride and cupric chloride or an equivalent etchant. Preferably, the etchant will etch the electrically conducting base material and not the just applied electrically conducting material. multi-layer structure at any point after the removal of the material between the pads, whether reflow or mechanical flattening have taken place.

The top layer of the cap structure described above could by formed from a carrier sheet made of an electrically conducting material. For example, the carrier sheet could be made of a metal. Examples of metals include copper and copper/INVAR/copper The sheet may be made from the same material as the electrically conducting plane in the cores of the circuit board. By forming the top layer of the cap from the same electrically conducting material as is used in the cores of the circuit board, problems associated with thermal expansion may be reduced or eliminated.

Advantages of the present invention include providing a flat surface to facilitate plating of solder to join a chip or other device to a multi-layer structure. The flat surface includes discreet conductors surrounded by dielectric material so that a solder mask to prevent undesirable flow of the solder is not required. Furthermore, the present invention allows for the attaching of devices without the need for sputtering or plating an electrical commoning layer on the composite panel.

A multi-layer electronic structure according to the present invention, one embodiment of which is shown in cross-section in FIG. 2, may include at least one core including a plane of an electrically conducting material with a plane of an electrically insulating material on both sides of the plane of electrically conducting material. The at least one core includes a plurality of plated through holes formed therethrough. A pad or cap is attached over at least one of the plated through holes. The pads/caps substantially completely seal the openings of the plated through holes. An electronic device including a plurality of ground, signal, and power sites, is attached to the pads/caps. Each of the ground, power, and/or signal sites is attached to one of the pads/caps. If the electronic device is attached to the pads/caps using solder balls, then the composite includes solder balls between the pads/caps and the attached electronic device.

In this disclosure, there is shown and described only the preferred embodiments of the invention, but, as aforementioned it is to be understood that the invention is capable of use in various other combinations and environments and is capable of changes or modifications within the scope of the inventive concept as expressed herein.

What is claimed is:

1. A process of forming a multi-layer electronic composite structure, said process comprising the steps of:

a) providing at least one core including at least one plane of at least one electrically conducting material with a plane of at least one electrically insulating material on both sides of the at least one plane of at least one electrically conducting material, said at least one core including a plurality of plated through holes formed therethrough plated with an electrically conducting material; and b) providing a pad of an electrically-conducting material over at least one of said plated through holes, said pad providing a flat surface for attaching an electronic device, each of said pad also preventing solder from entering said at least one plated through hole and providing an electrical connection between said electronic device and said at least one core, wherein said pad is formed by:

i) forming a panel by providing a plane of an electrically conducting material including a top surface and a bottom surface;

ii) depositing a layer of a photosensitive material on said top and bottom surfaces of said plane of at least one electrically conductive plane;

iii) exposing said photosensitive material on said bottom surface of said electrically conducting plane to radiation, said radiation causing photochemical reactions to occur within said photosensitive material, said bottom surface being exposed in a pattern matching a pattern of plated through holes formed in said at least one core;

iv) exposing all of said photosensitive material to radiation on said top surface of said electrically conducting plane;

v) removing portions of said photosensitive material not exposed to said radiation;

vi) depositing an electrically conducting material on portions of said electrically conducting material exposed by removing portions of said photosensitive material not exposed to said radiation;

vii) removing all remaining portions of said photosensitive material from said electrically conducting plane;

viii) aligning said electrically conducting material deposited on said electrically conducting plane with said plated through holes on said core;

ix) joining said plane to said at least one core by laminating said bottom surface of said plane to said core;

x) depositing a layer of a photosensitive material on said top surface of said plane;

xi) exposing selected portions of said photosensitive material on said top surface of said panel to radiation, said radiation causing photochemical reactions to occur within said photosensitive material;

xii) developing said photosensitive material to remove portions of said photosensitive material;

xiii) depositing an electrically conducting material where the portions of the photosensitive material were removed;

xiv) removing the remaining portions of the photosensitive material; and xv) etching said electrically conducting plane of said panel.

2. A process of forming a multi-layer electronic composite according to claim 1, further comprising the steps of:

a) reflowing said electrically conducting material deposited in step (xiii) of claim 1; and b) mechanically flattening said electrically conducting material subject to said reflowing.

3. A process of forming a multi-layer electronic composite according to claim 1, further comprising the step of cleaning the portions of said electrically conductive plane exposed by removing said portions of said photosensitive material in step (v) of claim 1.

4. A process of forming a multi-layer electronic composite according to claim 1, wherein said electronic device includes at least one ground, signal, and power site attached to said pad.

5. A process of forming a multi-layer electronic composite according to claim 1, wherein said electronic device is attached to said pad using a solder ball.

6. A process of forming a multi-layer electronic composite according to claim 1, wherein said electronic device is directly attached to said pad.

7. A process of forming a multi-layer electronic composite structure, said process comprising the steps of:

a) providing at least one core including at least one plane of at least one electrically conducting material with a plane of at least one electrically insulating material on both sides of the at least one plane of at least one electrically conducting material, said at least one core including a plurality of plated through holes formed therethrough plated with an electrically conducting material;

b) providing a pad of an electrically-conducting material over at least one of said plated through holes, said pad providing a flat surface for attaching an electronic device, each of said pad also preventing solder from entering said at least one plated through hole and providing an electrical connection between said electronic device and said at least one core;

c) forming a panel by providing a plane of an electrically conducting material including a top surface and a bottom surface;

d) depositing a layer of a photosensitive material on said top and bottom surfaces of said plane of at least one electrically conductive plane;

e) exposing said photosensitive material on said bottom surface of said electrically conducting plane to radiation, said radiation causing photochemical reactions to occur within said photosensitive material, said bottom surface being exposed in a pattern matching a pattern of plated through holes formed in said at least one core;

f) exposing all of said photosensitive material to radiation on said top surface of said electrically conducting plane;

g) removing portions of said photosensitive material not exposed to said radiation;

h) depositing an electrically conducting material on portions of said electrically conducting material exposed by removing portions of said photosensitive material not exposed to said radiation;

i) removing all remaining portions of said photosensitive material from said electrically conducting plane;

j) aligning said electrically conducting material deposited on said electrically conducting plane with said plated through holes on said core;

k) joining said panel to said at least one core by laminating said bottom surface of said panel to said core;

l) depositing a layer of a photosensitive material on said top surface of said panel;

m) exposing selected portions of said photosensitive material on said top surface of said panel to radiation, said radiation causing photochemical reactions to occur within said photosensitive material;

n) developing said photosensitive material to remove portions of said photosensitive material, thereby exposing portions of said plane of electrically conducting material;

o) etching away said exposed portions of said electrically conducting material using said photosensitive material not removed as a mask; and p) removing the remaining portions of the photosensitive material.

8. A process of forming a multi-layer electronic composite according to claim 7, further comprising the step of cleaning the portions of said electrically conductive plane exposed by removing said portions of said photosensitive material in step (f) of claim 7.

9. A process of forming a multi-layer electronic composite according to claim 7, wherein said electronic device includes at least one ground, signal, and power site attached to said pad.

10. A process of forming a multi-layer electronic composite according to claim 7, wherein said electronic device is attached to said pad using a solder ball.

11. A process of forming a multi-layer electronic composite according to claim 7, wherein said electronic device is directly attached to said pad.

* * * * *